United States Patent [19]

Shiobara et al.

[11] Patent Number: 5,731,370
[45] Date of Patent: Mar. 24, 1998

[54] SEMICONDUCTOR ENCAPSULATING EPOXY RESIN COMPOSITIONS WITH 2-PHENYL-4,5-DIHYDROXYMETHYLIMIDAZOLE CURING ACCELERATOR

[75] Inventors: Toshio Shiobara; Kazuhiro Arai; Kazuo Dobashi; Tadaharu Ikeda, all of Gunma-ken, Japan

[73] Assignee: Shin-Etsu Chemical Co., Ltd., Tokyo, Japan

[21] Appl. No.: 566,263

[22] Filed: Dec. 1, 1995

[30] Foreign Application Priority Data

Dec. 1, 1994 [JP] Japan ................... 6-323584

[51] Int. Cl.$^6$ .................. C08L 61/08; C08L 63/04; C08G 59/56
[52] U.S. Cl. ............... 523/466; 525/481; 528/98; 528/104; 528/117
[58] Field of Search ............... 523/466; 528/117, 528/98, 104; 525/481

[56] References Cited

U.S. PATENT DOCUMENTS

| | | | |
|---|---|---|---|
| 4,859,722 | 8/1989 | Shiobara et al. | |
| 4,942,190 | 7/1990 | Murayama et al. | 523/400 |
| 5,001,174 | 3/1991 | Yanagisawa et al. | 523/466 |
| 5,248,710 | 9/1993 | Shiobara et al. | 523/435 |
| 5,346,743 | 9/1994 | Uchida et al. | 428/76 |

FOREIGN PATENT DOCUMENTS 5-77686  10/1993  Japan .

*Primary Examiner*—Donald R. Wilson
*Attorney, Agent, or Firm*—Birch, Stewart, Kolasch & Birch, LLP

[57] ABSTRACT

A epoxy resin composition comprising (A) an epoxy resin bearing at least one monovalent hydrocarbon group on a benzene ring, (B) a phenolic resin, (C) an inorganic filler, and (D) 2-phenyl-4,5-dihydroxymethylimidazole as a curing accelerator has a low melt viscosity, a long gel time and a high curing rate, and provides cured products having improved properties. Semiconductor devices encapsulated with cured products of the inventive composition are reliable.

8 Claims, No Drawings

SEMICONDUCTOR ENCAPSULATING EPOXY RESIN COMPOSITIONS WITH 2-PHENYL-4,5-DIHYDROXYMETHYLIMIDAZOLE CURING ACCELERATOR

BACKGROUND OF THE INVENTION

1. Field of the Invention

This invention relates to an epoxy resin composition which has a low melt viscosity, a long gel time and a high curing rate and cures to products having high mechanical strength, high glass transition temperature, low moisture absorption, low linear expansion, and firm adhesion and more particularly, to an epoxy resin composition for use in encapsulating one-side molded semiconductor packages such as BGA packages. It also relates to a semiconductor device encapsulated with the composition in cured form.

2. Background Art

Heretofore, epoxy resin compositions comprising an epoxy resin, a phenolic resin as a curing agent and an inorganic filler have been widely used for semiconductor packages. In order to comply with an increased number of pins of semiconductor packages, there was developed a package known as a ball grid array (BGA) wherein a semiconductor chip is rested on an organic resin substrate having solder bumps and sealed on one side with an epoxy encapsulant. Due to the advantages including ease of soldering, possible mounting of plural semiconductor chips, and low manufacturing cost despite the high pin counts, this package now finds spreading applications.

Where BGA is sealed with the epoxy encapsulant to form a BGA package, however, there arises a critical problem that the BGA package formed of materials having different coefficients of expansion tends to deflect after molding to such an extent as to prohibit connection to a printed circuit board.

In Japanese Patent Publication (JP-B) Nos. 77686/1993 and 17458/1994, the latter being corresponding to U.S. Pat. No. 4,859,722, we proposed epoxy resin compositions which were improved in this respect. These epoxy resin compositions intend to reduce deflection of one-side molded packages by using a polyfunctional epoxy resin as a base so as to provide an increased glass transition temperature.

Packages encapsulated with these epoxy resin compositions can be deflected if their size is larger than 24 cm square. Because of a large package size and high pin counts, the number and length of gold wires to connect semiconductor chips to lines on the substrate are increased. This raises a problem that if a composition having a short gel time or a high viscosity is used for molding, gold wires can be bent and brought in mutual contact during molding.

Additionally, adhesion to solder masks on substrates is an important factor for improving the reliability of BGA packages. Therefore, it is desired in the semiconductor art to have an epoxy resin composition for encapsulating BGA packages having a low viscosity during molding, improved adhesion to solder masks and an ability to reduce the deflection of the packages.

SUMMARY OF THE INVENTION

The present invention is directed to an epoxy resin composition comprising an epoxy resin, a phenolic resin, an inorganic filler and a curing accelerator. When the epoxy resin is of the structural formula (1) defined below and the curing accelerator is of the structural formula (2) defined below, there is obtained an epoxy resin composition which is significantly extended in gel time as demonstrated by a gel time of 30 seconds or more at 175° C., maintains a curing time unchanged from conventional compositions as demonstrated by a curing time of 90 to 120 seconds at 175° C., achieves a glass transition temperature of at least 150° C. simply by molding and even a glass transition temperature of at least 180° C. by post curing, thus allows larger amounts of the inorganic filler to be loaded. The composition cured to a semiconductor package causes minimal deflection of the package, gives rise to no deformation of gold wires, and has good adhesion to the solder mask.

Accordingly, the present invention provides a semiconductor encapsulating epoxy resin composition comprising (A) an epoxy resin of the following structural formula (1):

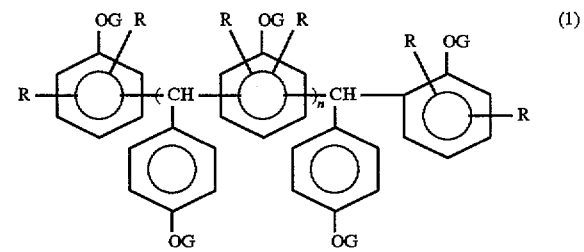

wherein G is a glycidyl group, R is a hydrogen atom or a monovalent hydrocarbon group, at least one of the R groups being a monovalent hydrocarbon group, and letter n is 0 or an integer of at least 1, (B) a phenolic resin, (C) an inorganic filler, and (D) an imidazole compound of the following structural formula (2):

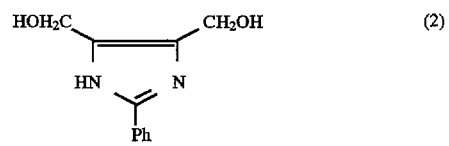

wherein Ph is a benzene ring (that is, a phenyl group) as a curing accelerator.

Also contemplated herein is a semiconductor device encapsulated with a cured product of the epoxy resin composition.

DETAILED DESCRIPTION OF THE INVENTION

A first essential component or component (A) of the semiconductor encapsulating epoxy resin composition according to the present invention is an epoxy resin of the following structural formula (1).

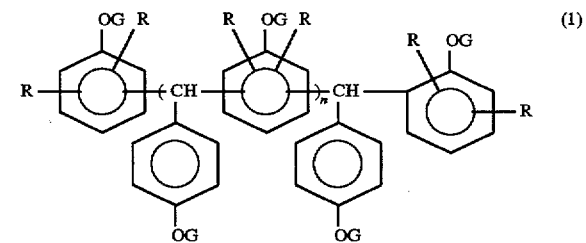

In formula (1), G is a glycidyl group. R is a hydrogen atom or a monovalent hydrocarbon group and at least one of the entire R groups is a monovalent hydrocarbon group. Letter n is 0 or an integer of at least 1.

The monovalent hydrocarbon groups represented by R are substituted or unsubstituted monovalent hydrocarbon groups including alkyl groups having 1 to 6 carbon atoms, especially 1 to 5 carbon atoms and aryl groups. Typical are methyl, ethyl, propyl, butyl, t-butyl and phenyl groups. Among others, the use of an epoxy resin of formula (1) containing a benzene ring having a monovalent hydrocarbon group with at least 3 carbon atoms in combination with an imidazole of formula (2) is effective for extending the gel time. A t-butyl group is desirable as the monovalent hydrocarbon group since it is most effective for such purposes.

In formula (1), it is required that at least one of the entire R groups be a monovalent hydrocarbon group while it is desirable that one to (4+2n) R groups, especially 4 to (4+2n) R groups be monovalent hydrocarbon groups. One analog to the epoxy resin of formula (1) is an epoxy resin of formula (1) wherein all R groups are hydrogen atoms, that is, of the following structural formula (3):

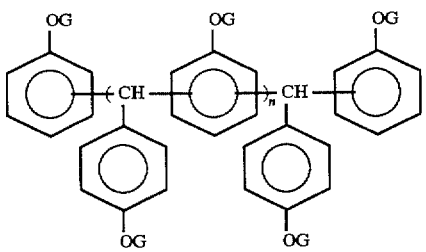

(3)

The epoxy resin of formula (3) bearing no organic groups on benzene rings, however, did not succeed in extending the gel time even in combination with the imidazole of formula (2) as will become evident from Comparative Example described later.

It is not well understood why the benefit of an extended gel time is accomplished only when the epoxy resin of formula (1) is used. Although the invention is not bound to the theory, it is believed that since the epoxy resin of formula (1) has a bulky substituent or substituents in its molecule, the extended gel time is attributable to the steric arrangement of the formula (1) epoxy resin which is different from that of the formula (3) epoxy resin.

In formula (1), letter n is 0 or an integer of at least 1, especially 0 or an integer of 1 to 10. A mixture of epoxy resins of formula (1) having different values of n is also acceptable. In this case, a preferred choice is made of an epoxy resin mixture having a molecular weight distribution wherein n representing an average degree of polymerization is 1 to 3 and containing at most 70% by weight, desirably at most 60% by weight of an epoxy resin of formula (1) wherein n=0. An epoxy resin mixture containing more than 70% by weight of an epoxy resin of formula (1) wherein n=0 would fail to achieve a glass transition temperature of at least 180° C. simply by molding and would fail to achieve a glass transition temperature of at least 200° C. even after by post curing.

Desirably, the epoxy resin of formula (1) has a softening point of 50° to 100° C. and an epoxy equivalent of 100 to 400. Resins with a softening point of lower than 50° C. would readily soften at room temperature (ex. 0° to 35° C.) and be difficult to handle and less efficient to work with. Resins with a softening point of higher than 100° C. would be difficult to uniformly knead or disperse, failing to achieve the desired benefits.

Several illustrative, non-limiting examples of the epoxy resin of formula (1) are given below.

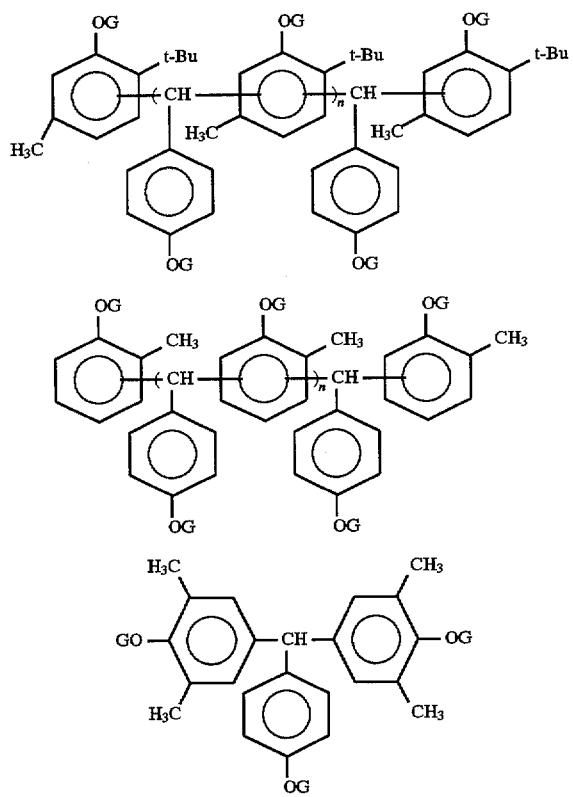

Note: t-Bu is tert-butyl group and OG is

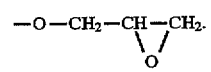

In the practice of the invention, another epoxy resin may be combined with the epoxy resin of formula (1). The other epoxy resins which are useful herein include bisphenol A epoxy resins, novolak type epoxy resins derived from such as phenol novolak resins or cresol novolak resins, alicyclic epoxy resins, glycidyl type epoxy resins and epoxy resins shown by the following formulae.

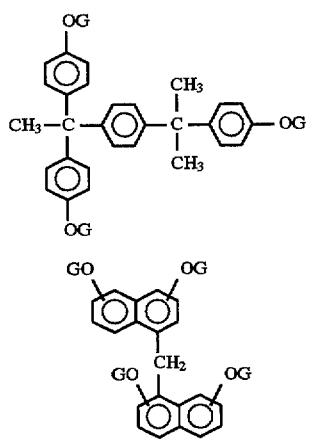

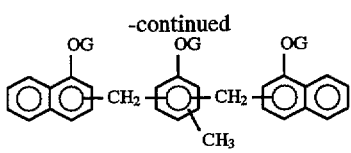

For flame retarding purposes, brominated epoxy resins may be used. Exemplary brominated epoxy resins are shown below.

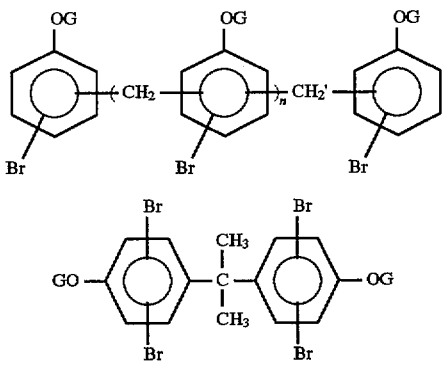

In the practice of the invention, the epoxy resin of formula (1) is used in an amount of 50 to 100% by weight, preferably 70 to 100% by weight, more preferably 80 to 100% by weight of the overall epoxy resin used herein.

A second essential component or component (B) of the inventive epoxy resin composition is a phenolic resin serving as a curing agent for the epoxy resin. Any desired phenolic resin may be used insofar as it has at least two phenolic hydroxyl groups in a molecule. Useful phenolic resins include phenol novolak resins, cresol novolak resins, naphthalene ring-containing phenol resins, phenol aralkyl type phenol resins, and triphenol alkane type phenol resins, all having at least two phenolic hydroxyl groups. Desirably the phenolic resin has a softening point of 60° to 120° C. and a hydroxyl equivalent of 90 to 150.

The phenolic resin (B) is preferably blended in such amounts that the equivalent ratio of epoxy groups in the epoxy resin to hydroxyl groups in the phenolic resin may range from 1/2 to 2/1. Usually phenolic resin (B) is used in an amount of 30 to 100 parts by weight, preferably 40 to 70 parts by weight per 100 parts by weight of the epoxy resin (A). On this basis, less than 30 parts of phenolic resin (B) would fail to achieve sufficient strength whereas with more than 100 parts of phenolic resin (B), some phenolic resin would be left unreacted, detracting from moisture resistance.

The epoxy resin composition of the invention further contains (C) an inorganic filler which is used for the purpose of reducing the coefficient of expansion of the composition or encapsulant for reducing stresses to semiconductor devices. For example, fused silica and crystalline silica in ground or spherical form are often used. Alumina, silicon nitride and aluminum nitride are also useful.

Preferably the inorganic filler has a mean particle size of about 1 to 30 μm, more preferably about 5 to 20 μm. The coefficient of expansion of the composition is dictated by the loading of inorganic filler. The loading of the inorganic filler is preferably 300 to 1,000 parts by weight per 100 parts by weight of epoxy resin (A) and phenolic resin (B) combined. Compositions containing less than 300 parts of the filler have a larger coefficient of expansion so that BGA packages might largely deflect and more stresses might be applied to semiconductor devices to detract from their properties. Compositions containing more than 1,000 parts of the filler have a higher viscosity to adversely affect molding. To meet both the requirements of moldability and low expansion of cured product, it is preferred to use a mixture of ground and spherical fillers or a spherical filler alone. It is recommended to use the inorganic fillers which have been surface treated with silane coupling agents.

A fourth essential component or component (D) of the inventive epoxy resin composition is a curing accelerator which is an imidazole compound of the following structural formula (2):

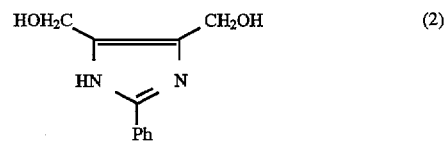

wherein Ph is a benzene ring (or phenyl group). The use of an imidazole of such structure allows larger amounts of the inorganic filler to be loaded and provides an epoxy resin composition which when cured to a semiconductor package, causes minimal deflection of the package, gives rise to no deformation of gold wires, and firmly adheres to the solder mask.

The imidazole of formula (2) (that is 2-phenyl-4,5-dihydroxymethylimidazole) has a melting point of 223°–225° C., by virtue of which the following advantage is obtained. Because of the very high melting point, no reaction takes place between the epoxy resin and the curing agent during manufacture of an epoxy resin composition. There is obtained an epoxy resin composition having a melt viscosity as originally designed. When the composition is heated to a molding temperature, the imidazole helps rapid reaction take place, enabling quick curing.

Preferably the imidazole of formula (2) is used in an amount of 0.001 to 10 parts by weight, more preferably 0.1 to 4 parts by weight per 100 parts by weight of epoxy resin (A) and phenolic resin (B) combined. Less than 0.001 part of the imidazole is ineffective for achieving quick curing whereas more than 10 parts of the imidazole would result in a too high curing rate to produce acceptable molded parts.

In the practice of the invention, it is acceptable that another curing accelerator such as imidazole derivatives, phosphine derivatives, and cycloamidine derivatives may be used in addition to the imidazole of formula (2).

Silicone flexibility imparting agents may be added to the epoxy resin composition for stress reducing purposes. There may be blended silicone rubber powder, silicone gel, and organic resin-silicone block copolymers. Alternatively, the organic filler may be treated on the surface with two part type silicone rubber and silicone gel. Usually such a stress-releasing agent is used in an amount of 0.5 to 10% by weight, preferably 1 to 5% by weight of the overall system. Less than 0.5% of the stress-releasing agent fails to provide impact resistance whereas more than 10% of the stress-releasing agent would adversely affect mechanical strength.

If desired, the epoxy resin composition of the invention may further contain various additives. Exemplary additives are mold release agents such as carnauba wax, higher fatty acids and synthetic wax, silane coupling agents, antimony oxide, and phosphorus compounds.

The epoxy resin composition of the invention is prepared by blending the above-mentioned essential and optional components, for example, by melt milling in a hot roll mil, melt kneading in a kneader, or melt kneading in a continuous extruder.

The epoxy resin composition thus obtained is useful in encapsulating various semiconductor devices therewith. The composition may be molded over semiconductor devices by any conventional technique such as transfer molding, injection molding, and casting. Desirably the epoxy resin composition is molded at a temperature of 150° to 180° C. and post cured at a temperature of 150° to 185° C. for 2 to 16 hours. The composition is especially suitable for one-side molded semiconductor packages such as BGA packages.

There has been described an epoxy resin composition characterized by the combined use of an epoxy resin of formula (1) and an imidazole of formula (2), which ensures an extended gel time although the epoxy resin is a polyfunctional one, maintains a viscosity low enough to cause no bending of gold wires in BGA encapsulation, and provides cured products having high mechanical strength, high glass transition temperature, low moisture absorption, low linear expansion, and firm adhesion. The epoxy resin composition has a low melt viscosity, a long gel time and a high curing rate. Semiconductor devices encapsulated with cured products of the inventive composition are highly reliable.

EXAMPLE

Examples of the present invention are given below by way of illustration and not by way of limitation. All parts and all %s are by weight.

Examples 1–3 and Comparative Examples 1–3

Six epoxy resin compositions were prepared by blending an epoxy resin, a phenolic resin, a brominated epoxy resin, silica, and an imidazole in amounts as reported in Table 1 together with 10 parts of antimony trioxide, 1.5 parts of γ-glycidoxypropyltrimethoxysilane, 1.0 part of carbon black, and 1.5 parts of carnauba wax, and uniformly melt mixing the blend in a hot two-roll mill.

Each of the epoxy resin compositions was measured for various properties. The results are shown in Table 1.

(1) Spiral Flow and Gel Time

Using a mold as prescribed by the EMMI standard, spiral flow was measured at 175° C. and 70 kg/cm². The gel time of a composition was measured on a hot plate at 175° C.

(2) Melt Viscosity

Using a Shimazu Koka type flow tester, melt viscosity was measured at 175° C.

(3) Flexural Strength (FS) and Flexural Modulus (FM)

Test bars of 10×100×4 mm which were molded at 175° C. and 70 kg/cm² for 2 minutes and post cured at 180° C. for 4 hours were tested according to JIS K6911.

(4) Glass Transition Temperature (Tg) and Coefficient of Linear Expansion (α)

Test pieces of 4×4×15 mm which were molded at 175° C. and 70 kg/cm² for 2 minutes and post cured at 180° C. for 4 hours were examined by means of a dilatometer while heating the test pieces at a rate of 5° C./min.

(5) Deflection of Package

Six BGA packages based on a BT resin substrate (20×20 mm, substrate thickness 0.2 mm) were encapsulated with the epoxy resin compositions, respectively, by molding at 175° C. and 70 kg/cm² for 2 minutes and post curing at 180° C. for 4 hours. The packages were measured for deflection, and a deflection in excess of 20 μm was rejected. At the same time, a deformation of the gold wire during molding was measured, and a deformation in excess of 15% was rejected.

TABLE 1

| Components (pbw) | E1 | E2 | E3 | CE1 | CE2 | CE3 |
|---|---|---|---|---|---|---|
| Epoxy resin (1) | 63 | | | | | 63 |
| Epoxy resin (2) | | 57 | | | | |
| Epoxy resin (3) | | | 60 | | | |
| Epoxy resin (4) | | | | 57 | | |
| Epoxy resin (5) | | | | | 62 | |
| Phenolic resin | 31 | 37 | 34 | 37 | 32 | 31 |
| Brominated epoxy resin | 6 | 6 | 6 | 6 | 6 | 6 |
| Silica | 600 | 600 | 600 | 600 | 600 | 600 |
| 2-phenyl-imidazole | — | — | — | — | — | 0.8 |
| 2PHZ | 1.0 | 1.0 | 1.0 | 1.0 | 1.0 | — |
| Properties | | | | | | |
| Spiral flow (cm) | 130 | 115 | 150 | 60 | 45 | 70 |
| Gel time (sec.) | 45 | 40 | 45 | 24 | 23 | 18 |
| Melt viscosity (poise) | 160 | 150 | 120 | 350 | 400 | 480 |
| FS (kgf/mm²) | 15 | 14 | 14 | 14 | 14 | 15 |
| FM (kg/mm²) | 2000 | 2100 | 2000 | 2000 | 2100 | 2000 |
| Tg (°C.) | 218 | 215 | 200 | 210 | 160 | 220 |
| α, at ≦ Tg | 1.4 | 1.4 | 1.5 | 1.4 | 1.4 | 1.4 |
| α, at ≦ Tg | 3.8 | 3.8 | 3.5 | 3.7 | 3.8 | 3.8 |
| Package deflection | 0/5 | 0/5 | 0/5 | 0/5 | 2/5 | 0/5 |
| Deformed Au wire | 0 | 0 | 0 | 4/5 | 5/5 | 5/5 |

| Epoxy resin | Softening point | Epoxy equivalent |
|---|---|---|
| (1) | 85° C. | 214 |

(n = 0; 59%; n = 1; 24%; n = 2; 8%, others 8%)

| | | |
|---|---|---|
| (2) | 79° C. | 165 |

(n = 0; 54%, n = 1; 31%, n = 2; 9%, others 6%)

| | | |
|---|---|---|
| (3) | 90° C. | 185 |

TABLE 1-continued (4) 81° C. 164

[structure with OG groups, (n = 0; 55%, n = 1; 28%, n = 2; 10%, others 7%)]

(5) 80° C. 210

[structure with OG and CH₃ groups, (n = 0; 7.7%, n = 1; 6.6%, n = 2; 7.7%, n = 3; 8.2%, n = 4; 8.2%, others 62%)]

Phenolic resin

[structure with OH groups, Softening point: 55° C., (n = 0; 4.8%, n = 1; 10.8%, n = 2; 38.9%, n = 3; 5%, n = 4; 12%, others 28%)]

Brominated epoxy resin

BREN-S (Nihon Kayaku K.K.)

[structure with OG and Br groups, (n = 0; 11%, n = 1; 8.9%, n = 2; 8.2%, n = 3; 7.5%, n = 4; 7%, others 57%)]

2PHZ
2-phenyl-4,5-dihydroxymethylimidazone (Sikoku Kasei K.K.)

Japanese Patent Application No. 323584/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A semiconductor encapsulating epoxy resin composition comprising:

(A) an epoxy resin of the following structural formula (1):

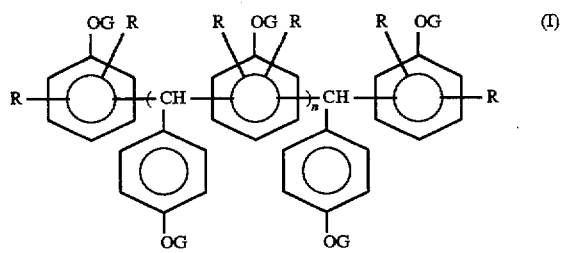

wherein G is a glycidyl group, R is a hydrogen atom, an alkyl group having 1 to 6 carbon atoms or a phenyl group, at least one of the R groups being an alkyl group having 1 to 6 carbon atoms or a phenyl group, and letter n is 0 or an integer of at least 1, (B) a phenolic resin having at least two phenolic hydroxyl groups in an amount of 30 to 100 parts by weight per 100 parts by weight of epoxy resin (A), (C) an inorganic filler selected from the group consisting of fused silica, crystalline silica, alumina, silicon nitride, and aluminum nitride in an amount of 300 to 1000 parts by weight per 100 parts by weight of epoxy resin (A) and phenolic resin (B) combined, and (D) an imidazole compound of the following structural formula (2):

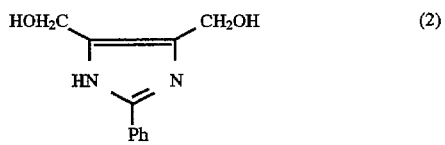

wherein Ph is a benzene ring as a curing accelerator in an amount of 0.001 to 10 parts by weight per 100 parts by weight of epoxy resin (A) and phenolic resin (B) combined.

2. A semiconductor encapsulating epoxy resin composition according to claim 1, wherein the phenolic resin has a softening point of 60° to 100° C. and a hydroxyl equivalent of 90 to 150.

3. A semiconductor encapsulating epoxy resin composition according to claim 1, wherein the imidazole compound of formula (2) has a melting point of 223° to 225° C.

4. A semiconductor encapsulating epoxy resin composition consisting essentially of:

(A) an epoxy resin of the following structural formula (1):

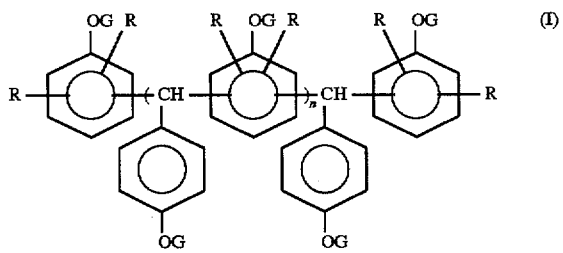

wherein G is a glycidyl group, R is a hydrogen atom, an alkyl group having 1 to 6 carbon atoms or a phenyl group, at least one of the R groups being an alkyl group having 1 to 6 carbon atoms or a phenyl group, and letter n is 0 or an integer of at least 1;

(B) a phenolic resin having at least two phenolic hydroxyl groups in an amount of 30 to 100 parts by weight per 100 parts by weight of epoxy resin (A);

(C) an inorganic filler selected from the group consisting of fused silica, crystalline silica, alumina, silicon nitride, and aluminum nitride in an amount of 300 to 1000 parts by weight per 100 parts by weight of epoxy resin (A) and phenolic resin (B) combined; and (D) an imidazole compound of the following structural formula (2):

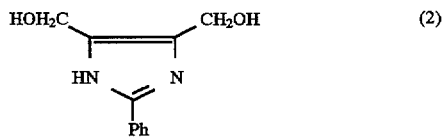

wherein Ph is a benzene ring as a curing accelerator in an amount of 0.001 to 10 parts by weight per 100 parts by weight of epoxy resin (A) and phenolic resin (B) combined.

5. A semiconductor encapsulating epoxy resin composition according to claim 1, wherein said epoxy resin composition exhibits a gel time of 30 seconds or more at 175° C.

6. The epoxy resin composition according to claim 1, wherein said epoxy resin composition exhibits a curing time of 90 to 120 seconds at 175° C.

7. The epoxy resin composition according to claim 1, wherein said epoxy resin composition achieves a glass transition temperature of at least 150° C.

8. The epoxy resin composition according to claim 7, wherein the glass transition temperature is at least 180° C. by post curing.

* * * * *